United States Patent
Bauer et al.

(10) Patent No.: US 7,638,418 B2
(45) Date of Patent: Dec. 29, 2009

(54) WIRING SUBSTRATE OF A SEMICONDUCTOR COMPONENT COMPRISING RUBBER-ELASTIC PADS EMBEDDED IN SAID WIRING SUBSTRATE AND METHOD FOR PRODUCING THE SAME

(75) Inventors: Michael Bauer, Nittendorf (DE); Rainer Steiner, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 11/676,869

(22) Filed: Feb. 20, 2007

(65) Prior Publication Data

US 2007/0194459 A1   Aug. 23, 2007

Related U.S. Application Data

(63) Continuation of application No. PCT/DE2005/001278, filed on Jul. 20, 2005.

(30) Foreign Application Priority Data

Aug. 19, 2004   (DE)   ........................ 10 2004 040 414

(51) Int. Cl.
*H01L 21/44* (2006.01)
(52) U.S. Cl. ................ 438/612; 257/774; 257/778; 257/737; 257/623; 257/E23.037
(58) Field of Classification Search ................ 257/774, 257/778, 737, 623, E23.037; 438/612
See application file for complete search history.

(56) References Cited

U.S. PATENT DOCUMENTS

| 5,759,047 | A | 6/1998 | Brodsky et al. |
| 5,900,674 | A | 5/1999 | Wojnarowski et al. |
| 6,020,220 | A | 2/2000 | Gilleo et al. |
| 6,265,245 | B1 | 7/2001 | Farnworth et al. |
| 6,358,836 | B1 * | 3/2002 | Lu et al. ...................... 438/618 |
| 6,399,896 | B1 | 6/2002 | Downes, Jr. et al. |
| 6,417,029 | B1 | 7/2002 | Fjelstad |
| 2002/0025587 | A1 | 2/2002 | Wada |

(Continued)

FOREIGN PATENT DOCUMENTS

DE   10134011 A1   1/2003

OTHER PUBLICATIONS

Ray Fillion, Laura Meyer, Kevin Durocher, Slawomir Rubinsztajn, David Shaddock, "Stress Free Area Array Structures for Flip Chips and Chip Scale Devices," 14th European Microelectronics and Packaging Conference & Exhibition Friedrichshafen, Germany, Jun. 23-25, 2003, GE Global Research Center, Niskayuna, NY.

*Primary Examiner*—Bradley K Smith
*Assistant Examiner*—Mohammad T Karimy
(74) *Attorney, Agent, or Firm*—Edell, Shapiro & Finnan, LLC

(57) ABSTRACT

A wiring substrate of a semiconductor component includes: an underside with a wiring structure; a top side with cutouts; a rubber-elastic material arranged in the cutouts; and external contact pads arranged on the rubber-elastic material and configured to be coupled to external contacts. A method for producing a wiring substrate of this type, involves pressing the rubber-elastic material pads into a precursor of a polymer plastic during the production process.

8 Claims, 6 Drawing Sheets

U.S. PATENT DOCUMENTS

| | | |
|---|---|---|
| 2002/0030288 A1 | 3/2002 | Hashimoto |
| 2002/0192865 A1 | 12/2002 | Imasu et al. |
| 2003/0121698 A1 | 7/2003 | Kyougoku et al. |
| 2003/0127747 A1* | 7/2003 | Kajiwara et al. ............ 257/778 |
| 2003/0168748 A1* | 9/2003 | Katagiri et al. ............. 257/778 |
| 2003/0201534 A1 | 10/2003 | Eichelberger et al. |
| 2004/0147060 A1 | 7/2004 | Seo |

* cited by examiner

WIRING SUBSTRATE OF A SEMICONDUCTOR COMPONENT COMPRISING RUBBER-ELASTIC PADS EMBEDDED IN SAID WIRING SUBSTRATE AND METHOD FOR PRODUCING THE SAME

CROSS REFERENCE TO RELATED APPLICATIONS

This application is a continuation of International Application No. PCT/DE2005/001278, filed on Jul. 20, 2005, entitled "Wiring Substrate of a Semiconductor Component Comprising External Contact Pads for External Contacts and Method for Producing the Same," which claims priority under 35 U.S.C. §119 to Application No. DE 102004040414.3 filed on Aug. 19, 2004, entitled "Wiring Substrate of a Semiconductor Component Comprising External Contact Pads for External Contacts and Method for Producing the Same," the entire contents of which are hereby incorporated by reference.

FIELD OF THE INVENTION

The invention relates to a wiring substrate of a semiconductor component comprising external contact pads for external contacts, and to methods for producing the same. In this case, solder balls optionally can be applied as external contacts to the external contact pads.

BACKGROUND

Wiring substrates of this type are used for semiconductor component housings, also known as BGA housings (ball grid array) or as LBGA housings (large ball grid array).

One of the problems of the wiring substrates is the reliability with which a connection between the external contact pads of the wiring substrate and a superordinate circuit board can be produced. In the event of cyclic thermal loadings, cyclic mechanical shear loadings are exerted on the solder connections on account of the presence of different materials having different coefficients of thermal expansion. In the event of vibration loadings, pressure fluctuations occur in addition to the shear loadings of the cyclic thermal stresses, and may in total lead to microcracks or to the failure of the connection.

Many different methods are used in the prior art in order to improve the reliability of the solder ball connections to superordinate circuit boards. Some methods are based on the configuration of the solder connections in order to reduce the mechanical loading. Other methods attempt to adapt the material properties of the housing packages in such a way that the mechanical loadings are reduced, such as for example by inserting semiconductor chip adhesive layers. Some of these solutions have the disadvantage that the adaptation of the housing substrates is very greatly dependent on the specific embodiment of the housings. These solutions require additional complex and expensive fabrication methods. These problems are also exasperated if a transition is made to smaller distances between the soldering contacts and to smaller connection pitches.

Moreover, a transition from lead-containing to lead-free solder materials, on account of different properties of the respective materials, will be more likely to increase rather than reduce the problems with regard to the loading limits of solder balls as external contacts. Further, possibilities for solving the problems involve introducing an additional material in the form of an underfiller between the wiring substrate of the housing and the superordinate circuit board. However, this requires an additional process step during the production of circuit boards and makes it more difficult to exchange or repair assemblies on the circuit boards.

Further solution approaches in the prior art provide for embodying the contacts themselves in flexible fashion, e.g., via the external contacts forming spring elements or being embodied from flexible materials in the form of elastomer balls with rubber-elastic cores. However, these variants with flexible contacts are highly cost-intensive and unsuitable for mass production. Moreover, reliability problems arise due to the low degree of robustness of the spring elements or elastomer balls as external contacts.

Flip-chip components, semiconductor chip size housings, and BGA housings have been proposed, which have solder balls which are arranged over an air-filled cavity or are arranged over a cavity filled with an elastic material. So-called "floating pad" solder balls of this type require a very complex cost-intensive fabrication method based on a specific military application and are therefore likewise not suitable for mass production. In principle, the cavities or the elastomer-filled cavities are realized by application of additional complex layers to the wiring substrate.

SUMMARY

The invention provides a wiring substrate of a semiconductor component comprising external contact pads for external contacts, and a method for producing the same by which it is possible to increase the reliability for components with solder balls as external contacts. Moreover, the invention provides a method which is suitable for the mass production of inexpensive semiconductor components.

According to an exemplary embodiment, a wiring substrate of a semiconductor component includes: an underside with a wiring structure, a top side with cutouts, a rubber-elastic material arranged in the cutouts, and external contact pads arranged on the rubber-elastic material and configured to be coupled to external contacts. A method for producing a wiring substrate of this type involves pressing the rubber-elastic material pads into a precursor of a polymer plastic during the production process.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures.

DETAILED DESCRIPTION

Figure 1:
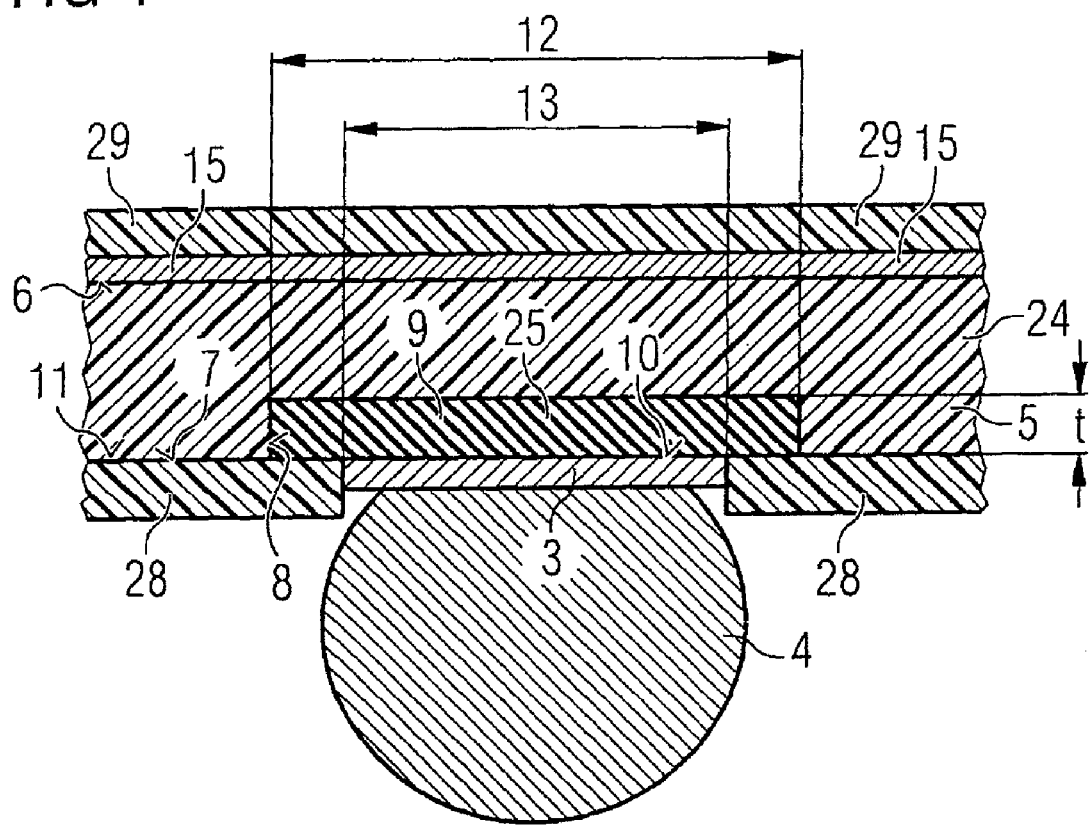
FIG. 1 shows a schematic cross section through a portion of a wiring substrate according to an exemplary embodiment of the invention.

The invention provides a wiring substrate of a semiconductor component comprising external contact pads for fitting external contacts. For this purpose, the rigid wiring substrate comprises an underside with a wiring structure and a top side with cutouts. A rubber-elastic material is arranged in the cutouts, wherein external contact pads are arranged on the rubber-elastic material.

This wiring substrate according to the invention differs from the previous solutions by virtue of the fact that no additional layers are to be applied to the wiring substrate. Rather, the wiring substrate itself serves to provide cutouts which can be filled with a corresponding rubber-elastic material, on the top side of which metallic external contact pads can be provided, which are also permitted to take up rigid external contacts and nevertheless enable the external contacts to yield to pressure cyclic loadings and cyclic thermal loadings by virtue of the fact that the rubber-elastic material in the cutouts is compressed and extended, and is likewise able to react to shear loadings by virtue of the fact that the rubber-elastic material in the cutouts permits tilting movements of the metallic contact pads.

In one exemplary embodiment of the invention, the top side of the rubber-elastic material together with the top side of the wiring substrate forms a coplanar area. The coplanar area has the advantage that, without transitions, it is possible to produce an arbitrary wiring structure and feed lines to external contact pads, to contact pads and/or to through contacts with high precision and without additional fabrication steps.

The cutouts in the substrate can be provided by simply pressing rubber-elastic material pads at the positions provided for external contacts into a precursor of the substrate. In order to bring about a coplanar area in this case, the substrate material of the precursor is merely preheated to form a composition having a high viscosity. Consequently, the formation of cutouts and the filling thereof can be realized by simple printing technology and do not require complicated lithographic coating, alignment, exposure, development, fixing and mounting methods.

In a further exemplary embodiment of the invention, the rubber-elastic material comprises silicones, silicone elastomers, and/or gels, and closed-pore soft-porous materials. These materials have the advantage that they can securely anchor the metallic external contact pads, on the one hand, and the advantage, on the other hand, that they have a compliance and can therefore compensate for inaccuracies and differences in diameter of the solder balls. Moreover, they can withstand impacts, pressure cyclic loadings, and also shear loadings, during corresponding thermal cyclic tests.

In this case, it is relatively unimportant what form the cutouts assume when the elastic material is pressed into the top side of the high-viscosity precursor of the substrate material. It may even be advantageous for the cutouts of a single wiring substrate to have different depths. Where the pressure cyclic loading or the shear cyclic loading is particularly high, it is possible to provide deeper cutouts in the substrate by preparing rubber-elastic material pads having a larger volume prior to being pressed into the high-viscosity material of the substrate.

A further feature of the present invention is that the areal extent of the cutout filled with rubber-elastic material is greater than the areal extent of the metallic external contact pads. In the case of this measure according to the invention, the effect of the rubber-elastic material is increased further since a compliance between the edge of the metallic contact pads and the edge of the cutouts is also ensured.

In a further preferred embodiment of the invention, the wiring substrate has feed lines from the wiring structure to the external contact pads. The feed lines can be made smaller in comparison with the areal extent of the external contact pads, with the result that they can follow the compliance of the rubber-elastic material in the cutouts without tearing or breaking.

Moreover, the wiring substrate may have through contacts through the wiring substrate which are connected to the feed lines and thus enable an electrical access to the external contact pads. Since the elasticity of the passage lines is not so great that they can follow a rubber-elastic deformation, these relatively rigid through contacts are arranged in the vicinity of the rubber-elastic material pads. The through contacts are then connected to the external contact pads via the feed lines.

A further possibility for broadening the applicability of the rubber-elastic material under an external contact pad involves accommodating conductive particles in the rubber-elastic material. The conductive particles must firstly have a high deformability, must additionally have a high compliance, and, finally, they must adapt to the expected great movements of the external contact pads. So-called "carbon nanotubes" are suitable for such a contact-making task, without impairing the rubber-elastic properties of the material below the external contact pads.

Such carbon nanotubes are hollow tubes having a single-walled or multiwalled hexagonal arrangement of carbon atoms and have a diameter of between a few nanometers and a few hundred nanometers. Since carbon nanotubes have no grain boundaries over their length of ten nanometers to a few millimeters, their deformability and elasticity and compliance are significantly greater than in the case of metal particles that are incorporated in customary electrically conductive plastic connections. The current-carrying capacity of the carbon nanotubes, with a value of $1\times10^9$ A/cm$^2$, is significantly greater as well. Moreover, owing to the lack of grain boundaries, the tensile strength is extremely high and, with a value of between $5\times10^{10}$ Pa to $5\times10^{13}$ Pa, is two or more orders of magnitude higher than in the case of customary metal particles, with the result that an interruption of the contact capability, if such carbon nanotubes are mixed with a rubber-elastic material, extremely low.

A further embodiment of the invention provides for the external contact pads to have a solder coating of a lead-free soldering material. The lead-free soldering material firstly improves the environmental compatibility and facilitates the recycling of such wiring substrates, and furthermore has the advantage that external contacts composed of solder balls can be connected to the external contact pads in an extremely simple manner.

In a further embodiment of the invention, a semiconductor chip is arranged on the wiring structure of the wiring substrate, which semiconductor chip can be connected by its flip-chip contacts directly to contact pads of the wiring structure. In the case of a semiconductor chip with contact areas on the active top side, the contact areas with the wiring structure are electrically connected to the wiring structure of the wiring substrate via corresponding bonding connections. For the method of operation and the interaction between a superordinate circuit board and the external contacts of the semiconductor component, it is not crucial whether the semiconductor chip is equipped with flip-chip contacts or with bonding connections.

All that is crucial is that the substrate carrying the external contact areas is mechanically closely connected to the semiconductor chip via the plastic housing composition, so that expansion differences between the semiconductor material and the superordinate circuit board, which usually comprises a fiber-reinforced epoxy resin, also affects the solder connection between the wiring substrate of the semiconductor component and the superordinate circuit board. A rubber-elastic compliance according to the invention of the external contact pads can alleviate the mechanical stress between semiconductor component and superordinate circuit board to an extent such that the risk of a faulty contact or of a tearing away of an external contact is avoided.

A method for producing a wiring substrate of a semiconductor component comprising external contact pads for fitting external contacts has the following method steps. The first step involves producing a baseplate with through contacts at predetermined positions, wherein the baseplate comprises a precursor of a polymer plastic. Afterward, a layer composed of rubber-elastic material is selectively applied to a top side of the baseplate, wherein the layer comprises rubber-elastic material pads that are spaced apart from one another. A copper film is then laminated with pressing in of the rubber-elastic material pads with the aid of the external contact pads onto the precursor of the polymer plastic of the baseplate. During this lamination, a coplanar interface is formed between copper film and top side of the baseplate. Afterward, the copper film can be structured to form external contact pads and feeds to the through contacts. This structuring is effected via lithography and etching technology. The polymer plastic of the baseplate is then cured with formation of a rigid self-supporting wiring substrate.

This method has the advantage that the rubber-elastic material pads can be realized by relatively coarse application techniques, such as printing techniques. Such printing techniques are known as jet printing technique, as screen printing technique or as stencil printing technique and yield a pattern of rubber-elastic material pads on the baseplate. The copper film is supported by corresponding lamination tools during the pressing of the rubber-elastic material pads into the high-viscosity plastic composition of the baseplate. The thickness of the plastic film can therefore correspond to the thickness of the external contact pads.

After the pressing of the external contact pads or of the rubber-elastic material into the substrate, the copper film can practically be structured into the feeds and external contact pads. Prior to this structuring or else after this structuring, the polymer plastic of the baseplate is cured with formation of a rigid self-supporting wiring substrate. During this curing, the chain molecules of the polymer crosslink to form a spatial pattern that is mechanically extremely stable.

In another method for producing a wiring substrate of a semiconductor component comprising external contact pads for fitting external contacts, the first step likewise involves providing a baseplate with through contacts at predetermined positions. In this case, the baseplate represents a precursor of a polymer plastic. Such precursors are polymer plastics which are not yet completely crosslinked and therefore have, at relatively low temperatures, a softening point at which the rigid precursor of a polymer plastic undergoes transition to a composition having a high viscosity. The precursor is solid at room temperature, with the result that a layer composed of rubber-elastic material can be selectively applied to the baseplate, to the top side of the baseplate. In this case, the layer has rubber-elastic material pads which are spaced apart from one another and are arranged at predetermined positions of the baseplate.

In another possible method, rather than a metal film being laminated on, a copper-coated film is then prepared, the metal coating of which has already been structured and has metallic external contact pads. The arrangement of the external contact pads on the film corresponds to the arrangement of the rubber-elastic material pads on the baseplate, with which the structured metal-coated film is then aligned. In this case, it is advantageous for the film material itself to have a transparent plastic, thereby facilitating the alignment. Afterward, during lamination, the rubber-elastic material pads on the top side of the baseplate and the external contact pads are pressed into the precursor of the polymer plastic of the baseplate. For this purpose, the baseplate is heated to the softening point of the precursor of the polymer plastic. A coplanar boundary layer arises between film and top side of the base layer in the process.

After this step, the external contact connection areas of the external contact pads are uncovered. This can be effected, on the one hand, by the corresponding regions of the copper-coated film being uncovered by the carrier film being resolved at the locations of the external contact pads through photolithographic steps, or by stripping the carrier film from the coplanar boundary layer. Finally, the polymer plastic of the baseplate can be cured with formation of a rigid self-supporting wiring substrate. During this curing, the precursor of the polymer plastic is crosslinked to a greater extent and thus acquires a greater dimensional stability.

In a further variant of the method, the rubber-elastic material pads are not prepared on the baseplate, but rather are applied on corresponding prepared metallic external contact pads of a structured metal-coated and possibly transparent plastic carrier film. This composite film, which already has external contact pads and the rubber-elastic material pads, can then be laminated onto the surface, with penetration of the rubber-elastic material pads into the precursor of the polymer plastic of the baseplate. After curing of the baseplate, the transparent plastic carrier film can subsequently be stripped from the coplanar boundary layer that is formed between film and top side of the baseplate.

In all three method variants, a self-supporting wiring substrate finally arises on whose underside a wiring structure can be applied which is connected to the through contacts and enables bondings to a semiconductor chip to be applied. Furthermore, soldering resist layers can be applied both on the top side and on the underside of the self-supporting wiring substrate in order to leave free only the external contact pads on the top side and corresponding contact pads for connections to the semiconductor chips to be applied. These contact pads are arranged differently on the wiring substrate depending on whether a semiconductor chip is to be connected directly by its flip-chip contacts on the wiring structure, or whether a semiconductor chip is to be connected via bonding connections to the wiring substrate and the wiring structure situated thereon.

In all three methods for pressing the rubber-elastic material pads into the material of the baseplate, a pattern of cutouts filled with rubber-elastic material is created in the wiring substrate, as a result of which the thickness of the wiring substrate is not increased and no additional coatings whatsoever of the wiring substrate is required for producing a rubber-elastic region below an external contact pad.

With this method, wiring substrates which do not require any additional rubber-elastic structures that increase the thickness of the substrate can be produced by cost-effective method steps, and a mechanical decoupling between semiconductor component and superordinate circuit board is nevertheless made possible. Since the dimensions of the rubber-elastic material pads can be chosen freely, it is also possible to attain different depths of the cutouts filled with rubber-elastic material in the wiring substrate.

To summarize, it can be established that with the wiring substrate according to the invention of a semiconductor component, the forces that act between the semiconductor component housing and a superordinate printed circuit board or circuit board can be taken up better because a rubber-elastic layer is in each case integrated into the wiring substrate below the external contact pads at the housing. Since the layer is embedded into the basic body or the baseplate of the wiring substrate and is provided at corresponding positions there as early as during the production of the substrate, the production of such rubber-elastic patterns is simplified and thus becomes more cost-effective.

When external forces act on the solder contact, the rubber-elastic layer below the external contact pads permits a limited excursion, preferably in the Z-direction, and thus enables stress absorption or damping in the event of vibration loadings. The thickness of the rubber-elastic layer can be varied depending on the required stress, in order thus to achieve an optimum balance between robustness and flexibility of the connection. Within a component, too, it is possible to vary the thickness in order to relieve the loading on relatively highly stressed contacts, e.g., external contacts in the corners of a wiring substrate.

Consequently, the following advantages are afforded in summary:

1. a higher reliability of the connection, particularly in drop tests that bring about a tensile loading in the Z-direction, but also in temperature cycle tests at a printed circuit board level;

2. contact-connection during testing is improved on account of the external contact pads mounted in rubber-elastic fashion;

3. for the end customer, underfilling of the interspace between semiconductor component housing and superordinate circuit board is obviated, so that the semiconductor components can be fitted on the superordinate circuit board by their external contacts in a simpler manner; and 4. the production process for such rubber-elastically cushioned external contact pads can be performed cost-effectively.

Consequently, a stress-absorbing layer is created in the wiring substrate or in a substrate interposer within the external contact pads or the ball pads and a partial mechanical decoupling of housing and superordinate circuit board is thus achieved.

Exemplary embodiments of the invention will now be described in connection with the drawings. FIG. 1 shows a schematic cross section through a portion of a wiring substrate 5. The wiring substrate 5 has a baseplate 24 having a top side 7 and an underside 6. A rubber-elastic material 9 is introduced into the baseplate 24 from the top side 7, which material forms a rubber-elastic material pad 25 and fills a cutout 8 in the top side 7 of the wiring substrate 5.

The rubber-elastic material pad 25 incorporated into the baseplate 24 has a top side 10 forming a coplanar area 11 with the top side 7 of the wiring substrate 5. A metallic external contact pad 3 is arranged on the coplanar area 11 of the wiring substrate 5 in the region of the rubber-elastic material pads 25. The areal extent 13 of the external contact pad 3 is less than the areal extent 12 of the rubber-elastic material pad 25.

Since the rubber-elastic material pad 25 is compliant, shear loadings on account of thermal strains or vibration loadings which act on the external contact pads 3 can be reduced and/or damped. For this purpose, the depth t of the cutouts 8 of a wiring substrate 5 of a semiconductor component can be adapted to the expected loadings, with the result that, for example, corner contacts are buffered with a thicker rubber-elastic layer than external contacts 4 in the center of the semiconductor component.

A feed line (not visible in the cross section shown in FIG. 1) connects the external contact pad 3, and thus the external contact 4 fitted onto the latter, to a wiring structure 15 arranged on the underside 6 of the wiring substrate 5. The top side 7 of the wiring substrate 5 is covered with an upper soldering resist layer 28 such that it leaves free the external contact pads 3 carrying the external contacts 4. On the underside 6, the wiring structure 15 is protected against damage by a lower soldering resist layer 29. The advantages of such a wiring substrate 5 with external contact 4 mounted in rubber-elastic fashion have already been discussed above and are therefore omitted at this juncture.

FIGS. 2 to 7 show schematic cross sections through individual components during the production of a wiring substrate for semiconductor components. Components having the same functions as in FIG. 1 are identified by identical reference symbols in FIGS. 1 to 7 and are not discussed separately. The production of such wiring substrates can be undertaken independently of semiconductor chip manufacturers by supplier companies that have previously supplied metallic leadframes.

Figure 2:
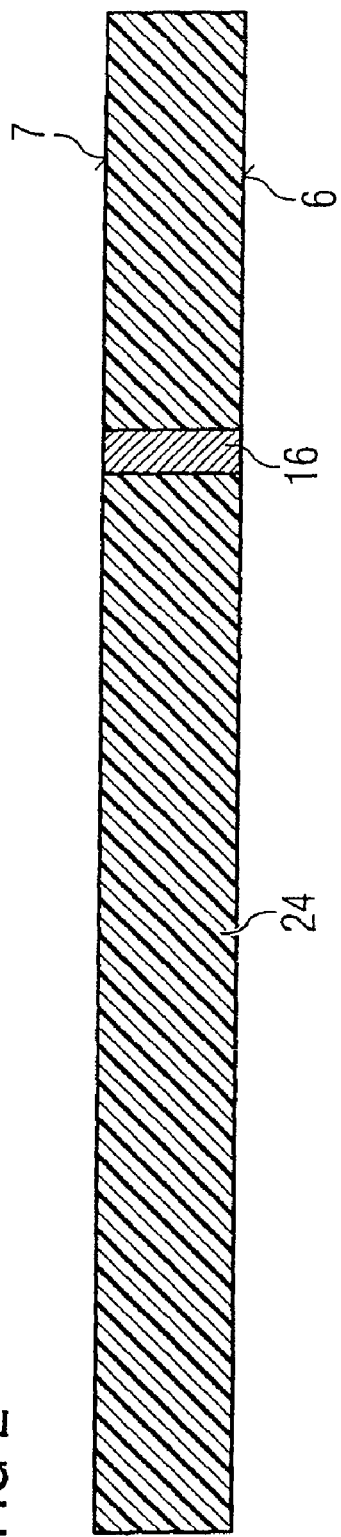
FIG. 2 shows a schematic cross section through a baseplate of a precursor of a polymer plastic.

FIG. 2 shows a schematic cross section through a baseplate 24 composed of a precursor of a polymer plastic. The baseplate 24 has a top side 7 and an underside 6. From the top side 7 to the underside 6, through contacts 16 are arranged at envisaged positions in the baseplate 24. The through contacts 16 serve for connecting the external contact pads to be produced on the top side 7 of the baseplate 24 to a wiring structure to be produced on the underside 6 of the baseplate 24.

Figure 3:
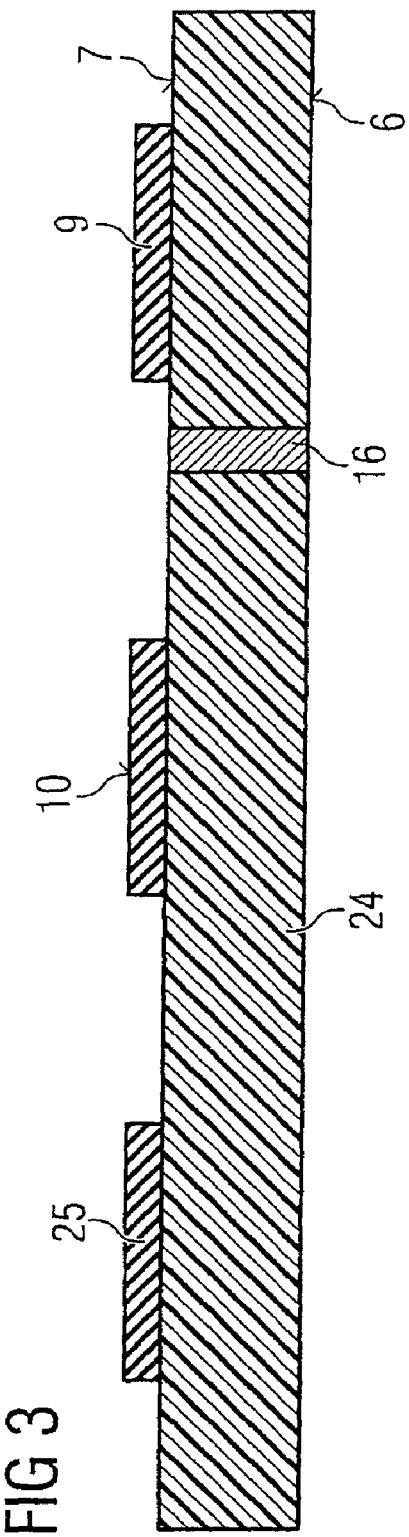
FIG. 3 shows a schematic cross section through the baseplate in accordance with FIG. 1 after application of rubber-elastic material pads.

FIG. 3 shows a schematic cross section through the baseplate 24 in accordance with FIG. 1 after application of rubber-elastic material pads 25. The rubber-elastic material pads 25 may have a different thickness in order thus to produce cutouts of different depths in the baseplate 24 which are filled with rubber-elastic material 9.

Figure 4:
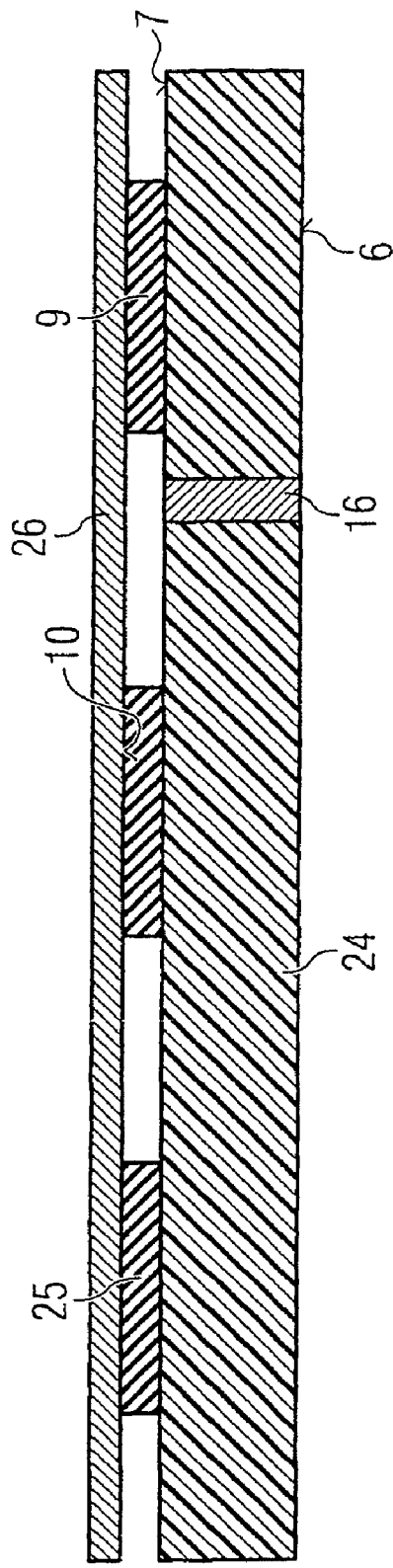
FIG. 4 shows a schematic cross section through the baseplate in accordance with FIG. 2 after application of a metal film.

FIG. 4 shows a schematic cross section through the baseplate 24 in accordance with FIG. 2 after application of a metal film 26. The metal film 26 is applied in order subsequently to be laminated onto the surface 7 of the baseplate 24. During the lamination operation, the baseplate 24 composed of a precursor of a polymeric plastic is heated to form a composition having high viscosity and the metal film 26 is laminated on with pressing of the rubber-elastic metal pads 25 into the baseplate 24. A connection between the through contact 16 and the metal film 26 is also provided in the process.

Figure 5:
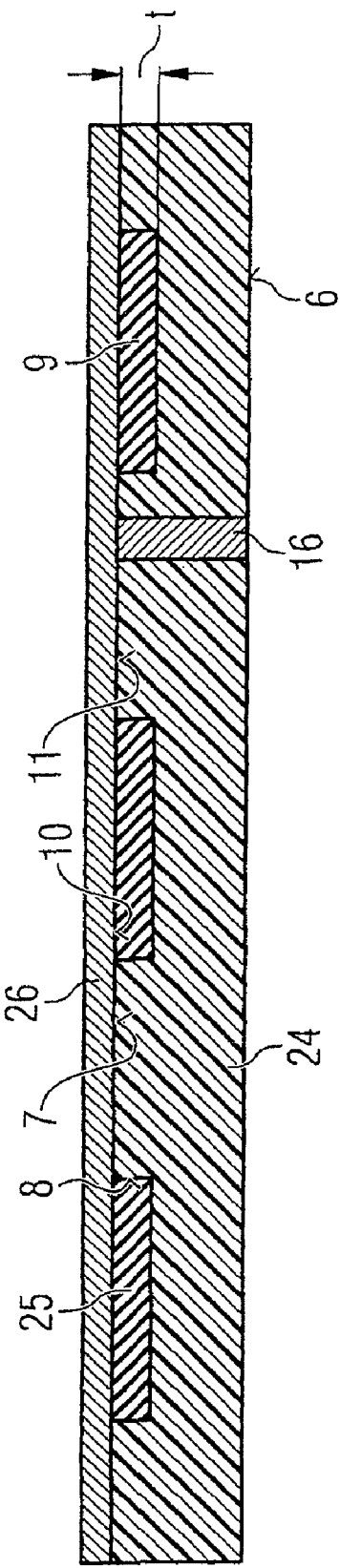
FIG. 5 shows a schematic cross section through the baseplate in accordance with FIG. 4 after pressing of the rubber-elastic material pads into the baseplate.

FIG. 5 shows a schematic cross section through the baseplate 24 in accordance with FIG. 4 after pressing of the rubber-elastic material pads 25 into the baseplate 24, giving rise to a coplanar surface 11 comprising the top sides 10 of the rubber-elastic material pads 25 and the top side 7 of the baseplate 24. When the rubber-elastic material pads 25 are pressed into the high-viscosity precursor of the polymer plastic of the baseplate 24, the rubber-elastic metal pads 25 penetrate into the baseplate 24 as far as a depth t. Even though the depth t is identical in this example for the three rubber-elastic metal pads 25 shown, it can nevertheless, as already mentioned above, also be different and depend on the expected loading of the external contact pads 3 to be fitted.

Figure 6:
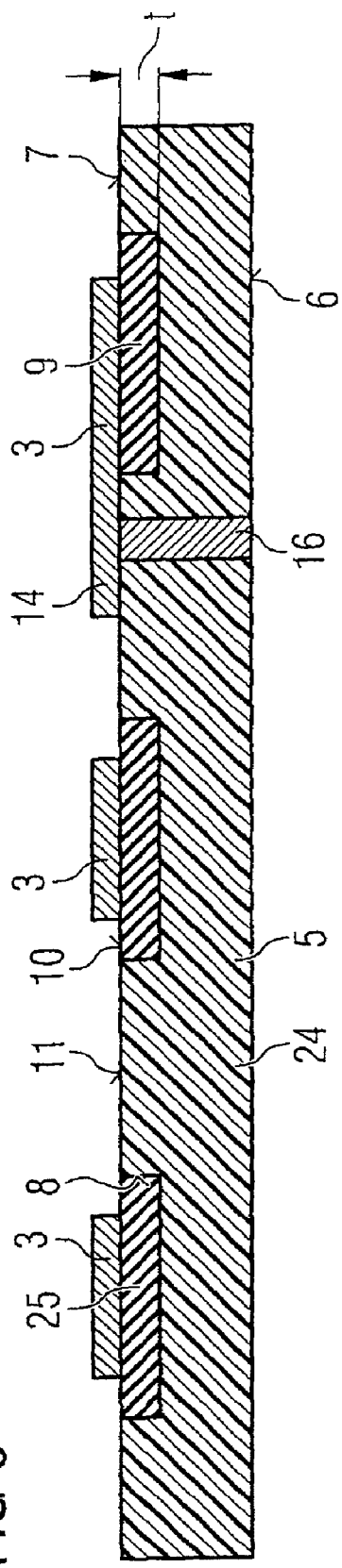
FIG. 6 shows a schematic cross section through the baseplate after structuring of the metal film to form cutout pads and feed lines.

FIG. 6 shows a schematic cross section through the baseplate 24 after structuring of the metal film 26 from FIG. 5 to form external contact pads 3 and feed lines 14. The feed lines 14 are narrow conductor tracks which connect the external contact pads 3 to corresponding through contacts 16 which are positioned such that they do not adversely affect the deformability of the rubber-elastic metal pads 25. In order to achieve a high deformability of the rubber-elastic material pads 25, the latter are produced from insulating silicones, silicone elastomers, gels or soft-porous insulating materials and are not suitable for the conduction of the electric current. In a variation of the rubber-elastic material pads 25 shown in FIG. 6, the pads may be filled with correspondingly compliantly electrically conductive particles, known as carbon nanotubes in the literature, with the result that through contacts 16 can also be provided underneath, i.e., in the region of the rubber-elastic metal pads 25, in the baseplate 24.

Figure 7:
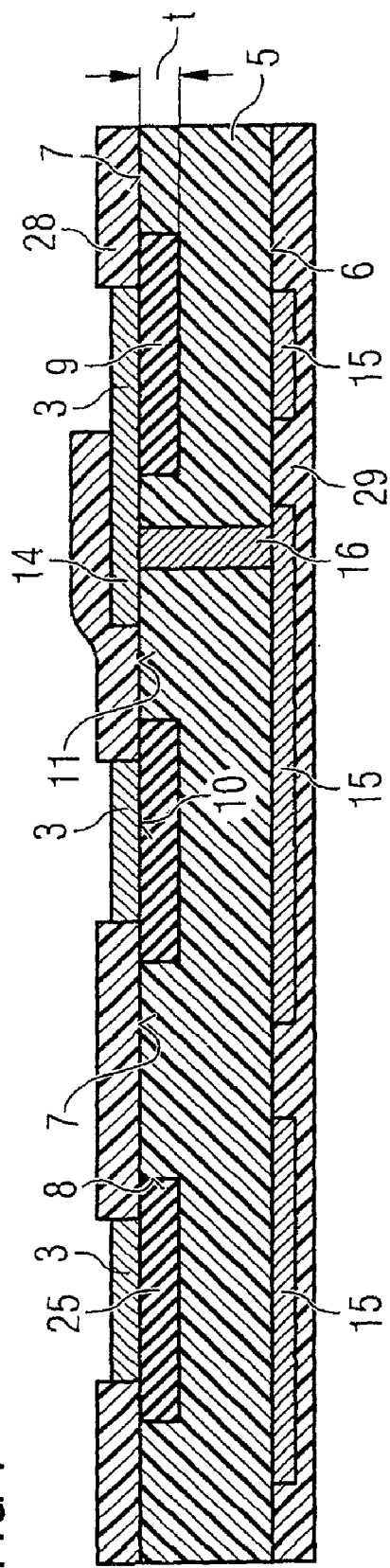
FIG. 7 shows a schematic cross section through a wiring substrate according to an exemplary embodiment of the invention.

FIG. 7 shows a schematic cross section through a wiring substrate 5 in accordance with one embodiment of the invention. The precursor of a wiring substrate 5 as shown in FIG. 6 is completed by the application of an upper soldering resist layer 28 to the top side 7 of the wiring plate 5 whilst leaving free the external contact pads 3. In addition, the wiring structure 15 is applied to the underside 6 and, for its part, can be protected against damage by a lower soldering resist layer 29. This lower wiring structure 15 serves to electrically connect the external contact pads 3 on the top side 7 of the wiring substrate to a semiconductor chip on the underside 6 of the wiring substrate 5 via the through contacts 16.

Figure 8:
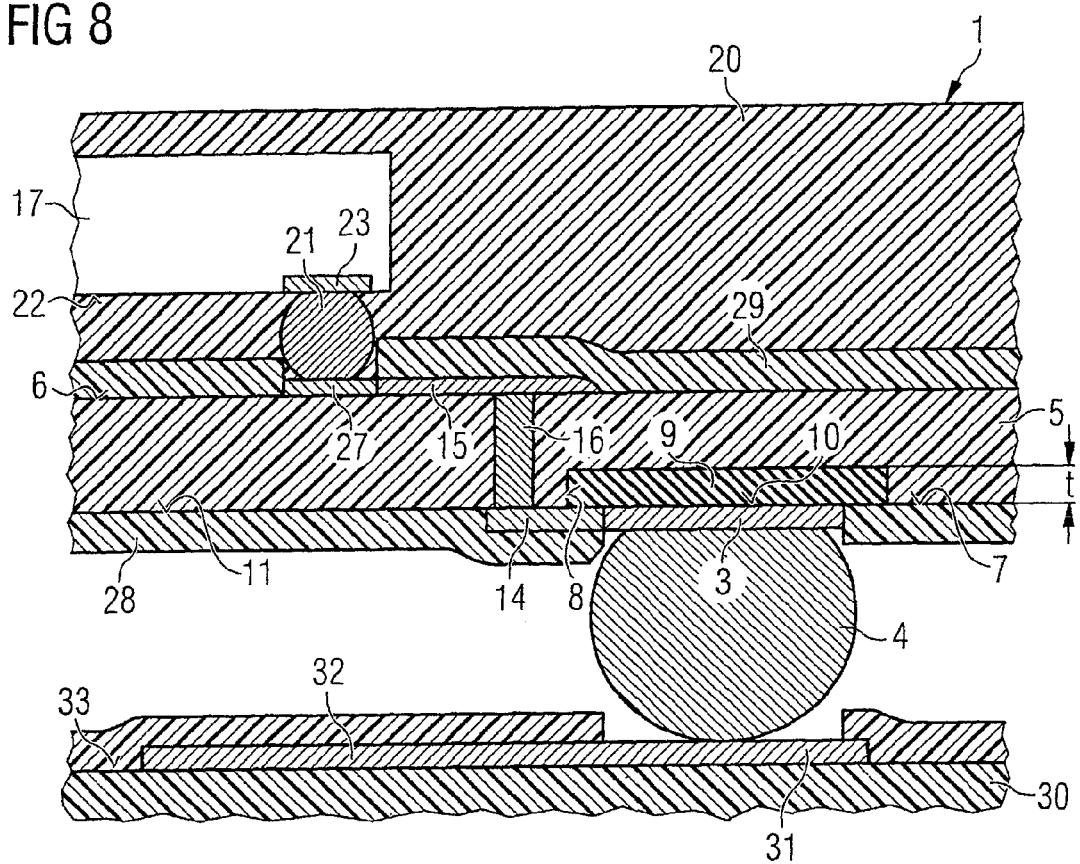
FIG. 8 shows a schematic cross section through a portion of a semiconductor component of an exemplary embodiment of the invention, mounted onto a superordinate circuit board.

FIG. 8 shows a schematic cross section through a portion of a semiconductor component 1 of a first embodiment of the invention, which is mounted onto a superordinate circuit board 30. Components with the same functions as in the previous figures are identified by identical reference symbols and are not discussed separately. The wiring substrate 5 with its rubber-elastically cushioned external contact pad 3 has an external contact 4. The external contact 4 is connected via the external contact pads 3 to a feed line 14, and also a through contact 16 of a wiring structure 15 on the underside 6 of the wiring substrate 5. The wiring structure 15 has contact pads 27, which are connected to a flip-chip contact 21 of a semiconductor chip 17 in this semiconductor component 1 of the first embodiment of the invention.

The external contact 4, for its part, is connected to a solder pad 31 of a conductor track structure 32 on the top side 33 of the superordinate circuit board 30. As a result of the rubber-elastic material pad 25 buried in the wiring substrate 5 of the semiconductor component 1, pressure cyclic loadings in the form of vibrations and shear loadings as a result of thermal stresses can be rubber-elastically cushioned and absorbed, with the result that this connection between the semiconductor component 1 and the superordinate circuit board 30 via such a rubber-elastically cushioned external contact 4 have a higher reliability.

Figure 9:
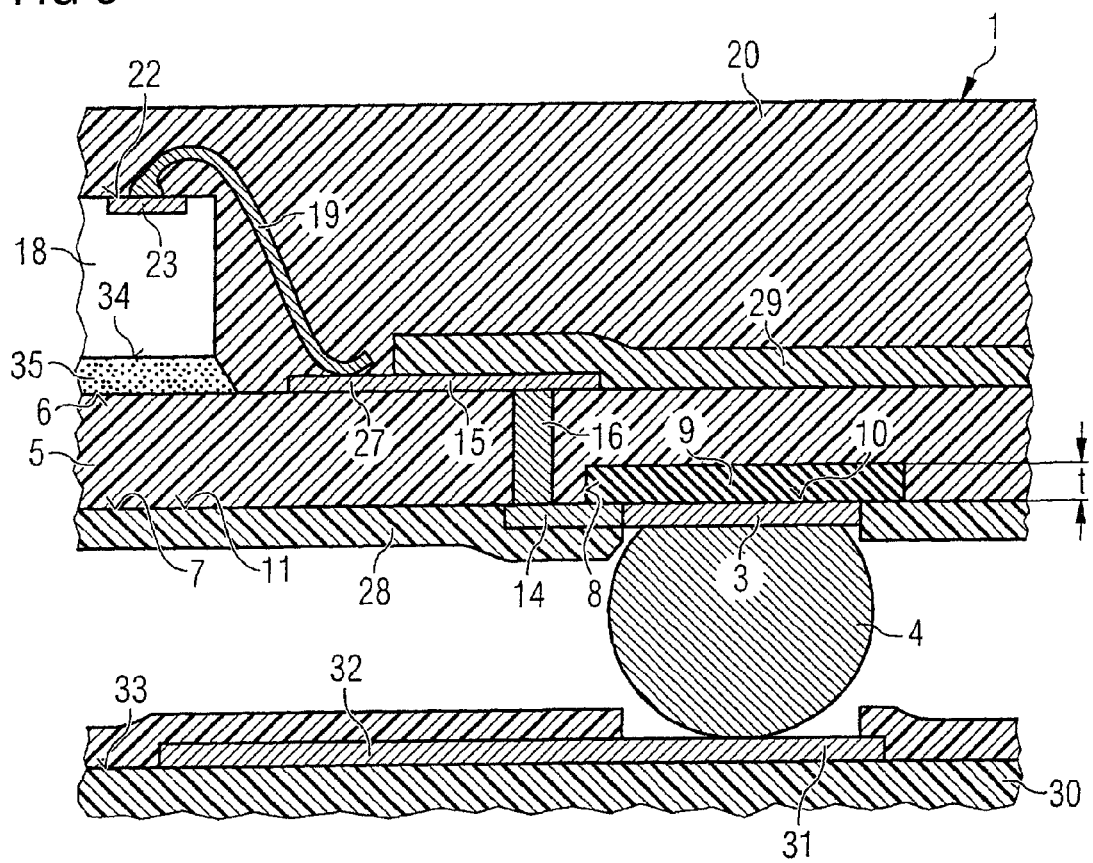
FIG. 9 shows a schematic cross section through a portion of a semiconductor component of another exemplary embodiment of the invention, mounted onto a superordinate circuit board.

FIG. 9 shows a schematic cross section through a portion of a semiconductor component 2 of a second embodiment of the invention, which is mounted onto a superordinate circuit board 30. Components having the same functions as in FIG. 8 are identified by identical reference symbols and are not discussed separately.

This second embodiment of a semiconductor component 2 according to the invention differs from the semiconductor component shown in FIG. 8 by virtue of the fact that the active top side 22 of the semiconductor chip 18 has contact areas 23 which are connected via a bonding connection 19 to the contact pad 27 of the wiring structure 15 on the underside 6 of the wiring substrate 5. Furthermore, the rear side 34 of the semiconductor chip 18 is mechanically connected to the wiring substrate 5 via an adhesive layer 35. The semiconductor chip 18 with the bonding connection 19, and also the structures on the underside 6 of the wiring substrate 5 are surrounded by a plastic housing composition 20 that protects the entire construction of the semiconductor component 2 against damage.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method for producing a wiring substrate of a semiconductor component comprising external contact pads for fitting external contacts, the method comprising:
    producing a baseplate with through contacts at predetermined positions, wherein the baseplate comprises a precursor of a polymer;
    selectively applying a layer comprising a rubber-elastic material to a top side of the baseplate, wherein the layer comprises rubber-elastic material pads that are spaced apart from one another;
    laminating a copper film and pressing the rubber-elastic material pads with the external contact pads into the precursor of the polymer of the baseplate to embed the rubber-elastic material pads in the baseplate and form a coplanar boundary layer between the copper film and the top side of the baseplate;
    structuring the copper film to form external contact pads and feed lines to the through contacts; and
    curing the precursor of polymer of the baseplate to form a rigid self-supporting wiring substrate.

2. The method as claimed in claim 1, applying an upper soldering resist layer to the top side of the self-supporting wiring substrate with the external contact pads being uncovered.

3. The method as claimed in claim 1, further comprising selectively applying a solder layer to the external contact pads.

4. The method as claimed in claim 1, further comprising coating an underside of the self-supporting wiring substrate with a wiring structure.

5. The method as claimed in claim 1, further comprising coating an underside of the self-supporting wiring substrate with a soldering resist layer while leaving free contact pads of the wiring structure.

6. The method as claimed in claim 1, wherein the precursor of polymer is plastic.

7. A method for producing a wiring substrate of a semiconductor component comprising external contact pads for fitting external contacts, the method comprising:

producing a baseplate with through contacts at predetermined positions, wherein the baseplate comprises a precursor of a polymer;

selectively applying a layer comprising a rubber-elastic material to a top side of the baseplate, wherein the layer comprises rubber-elastic material pads that are spaced apart from one another;

laminating a copper-coated film structured with external contact pads with alignment of the external contact pads, wherein the arrangement of the external contact pads corresponds to the rubber-elastic material pads;

pressing the rubber-elastic material pads with the external contact pads into the precursor of the polymer of the baseplate to embed the rubber-elastic material pads in the baseplate and form a coplanar boundary layer between the copper-coated film and the top side of the baseplate;

uncovering the external contact pads; and curing the precursor of polymer of the baseplate to form a rigid self-supporting wiring substrate.

8. The method as claimed in claim 7, wherein the precursor of polymer is plastic.

* * * * *